(12) United States Patent
Nguyen

(10) Patent No.: US 8,199,494 B2
(45) Date of Patent: Jun. 12, 2012

(54) THUMBSCREW FOR PLUGGABLE MODULES

(75) Inventor: Long Van Nguyen, San Jose, CA (US)

(73) Assignee: Finisar Corporation, Inc., Sunnyvale, CA (US)

( * ) Notice: Subject to any disclaimer, the term of this patent is extended or adjusted under 35 U.S.C. 154(b) by 704 days.

(21) Appl. No.: 12/334,309

(22) Filed: Dec. 12, 2008

(65) Prior Publication Data

US 2010/0149759 A1 Jun. 17, 2010

(51) Int. Cl.
*G06F 1/16* (2006.01)

(52) U.S. Cl. .................. 361/679.58; 361/732; 361/740; 312/223.1; 312/223.2

(58) Field of Classification Search .................. 361/732
See application file for complete search history.

(56) References Cited

U.S. PATENT DOCUMENTS

| | | | | |
|---|---|---|---|---|
| 2,729,134 A * | 1/1956 | Stanton, Jr. et al. | | 411/6 |
| 5,020,949 A * | 6/1991 | Davidson et al. | | 411/7 |
| 5,859,766 A * | 1/1999 | Van Scyoc et al. | | 361/752 |
| 5,920,459 A * | 7/1999 | Weber et al. | | 361/752 |
| 5,947,509 A * | 9/1999 | Ricks et al. | | 280/728.2 |
| 6,166,917 A * | 12/2000 | Anderson | | 361/756 |
| 6,364,688 B1 * | 4/2002 | Fraley et al. | | 439/362 |
| 6,654,253 B1 * | 11/2003 | DiMarco | | 361/730 |
| 7,033,202 B2 * | 4/2006 | Wu | | 439/362 |
| 7,042,737 B1 * | 5/2006 | Woolsey et al. | | 361/799 |
| 7,167,380 B2 * | 1/2007 | Ice | | 361/796 |
| 7,210,586 B2 * | 5/2007 | Ice | | 211/26 |
| 7,277,296 B2 * | 10/2007 | Ice | | 361/756 |
| 7,291,035 B2 * | 11/2007 | Rose et al. | | 439/362 |
| 7,349,226 B2 * | 3/2008 | Ice | | 361/796 |
| 7,377,799 B2 * | 5/2008 | Kuo | | 439/362 |
| 7,414,852 B1 * | 8/2008 | Otte | | 361/726 |
| 7,457,134 B2 * | 11/2008 | Ice | | 361/816 |
| 7,626,813 B2 * | 12/2009 | Weng et al. | | 361/679.37 |
| 7,710,734 B2 * | 5/2010 | Ice et al. | | 361/730 |
| 2002/0006026 A1 * | 1/2002 | Takahashi et al. | | 361/687 |
| 2007/0202733 A1 * | 8/2007 | Rose et al. | | 439/362 |
| 2010/0039778 A1 * | 2/2010 | Ice | | 361/728 |

* cited by examiner

*Primary Examiner* — Anthony Q Edwards
(74) *Attorney, Agent, or Firm* — Maschoff Gilmore & Israelsen

(57) ABSTRACT

In one example, a pluggable module comprises a shell, a module connector, and one or more thumbscrews. The shell defines a cavity within which a PCB and one or more components are disposed and includes a front, back, first side, and second side. The module connector is operatively connected to the PCB near the back of the shell and extends from within the cavity to outside the shell through an opening defined in the back of the shell. The module connector is configured to operatively couple the pluggable module to a host device. The thumbscrews are housed within one or more portions of the shell and are configured to threadably secure the pluggable module to the host device. Each of the thumbscrews comprises a torque limiter. The pluggable module can further comprise protecting means for protecting a portion of the module connector extending outside the cavity from damage.

18 Claims, 13 Drawing Sheets

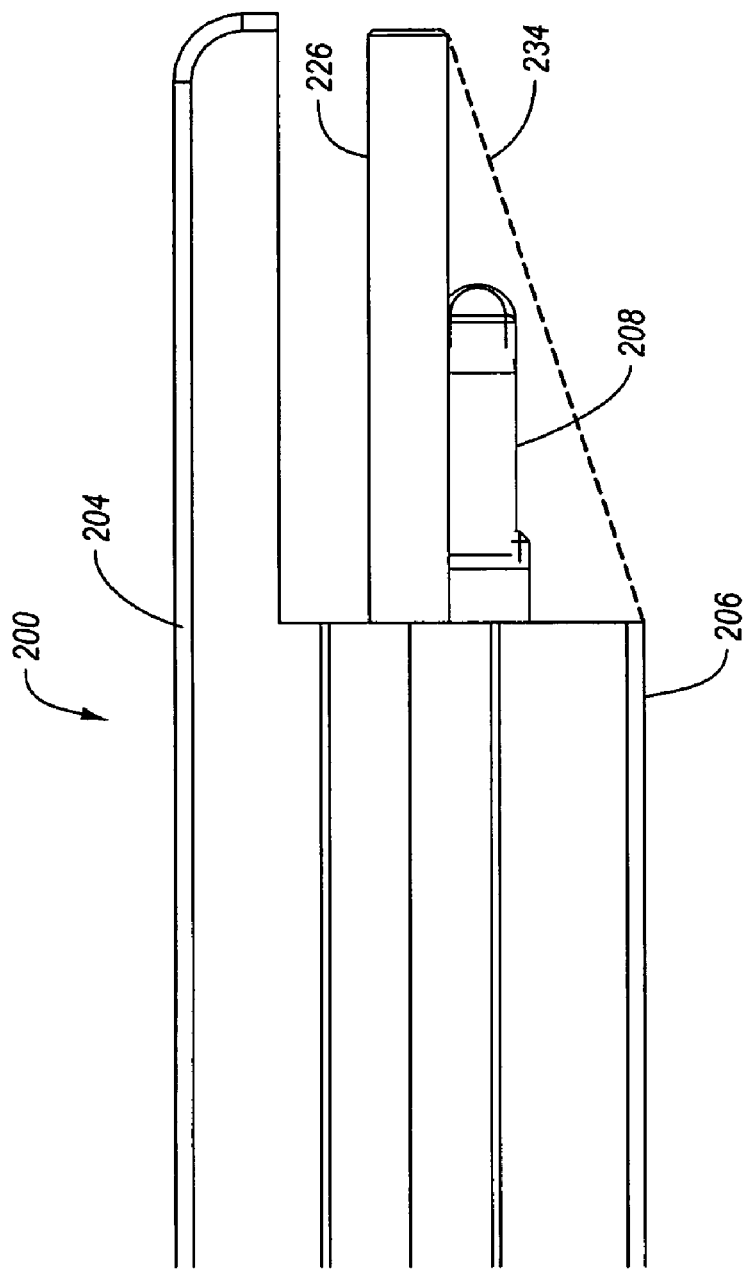
Fig. 2C
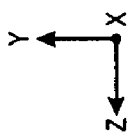

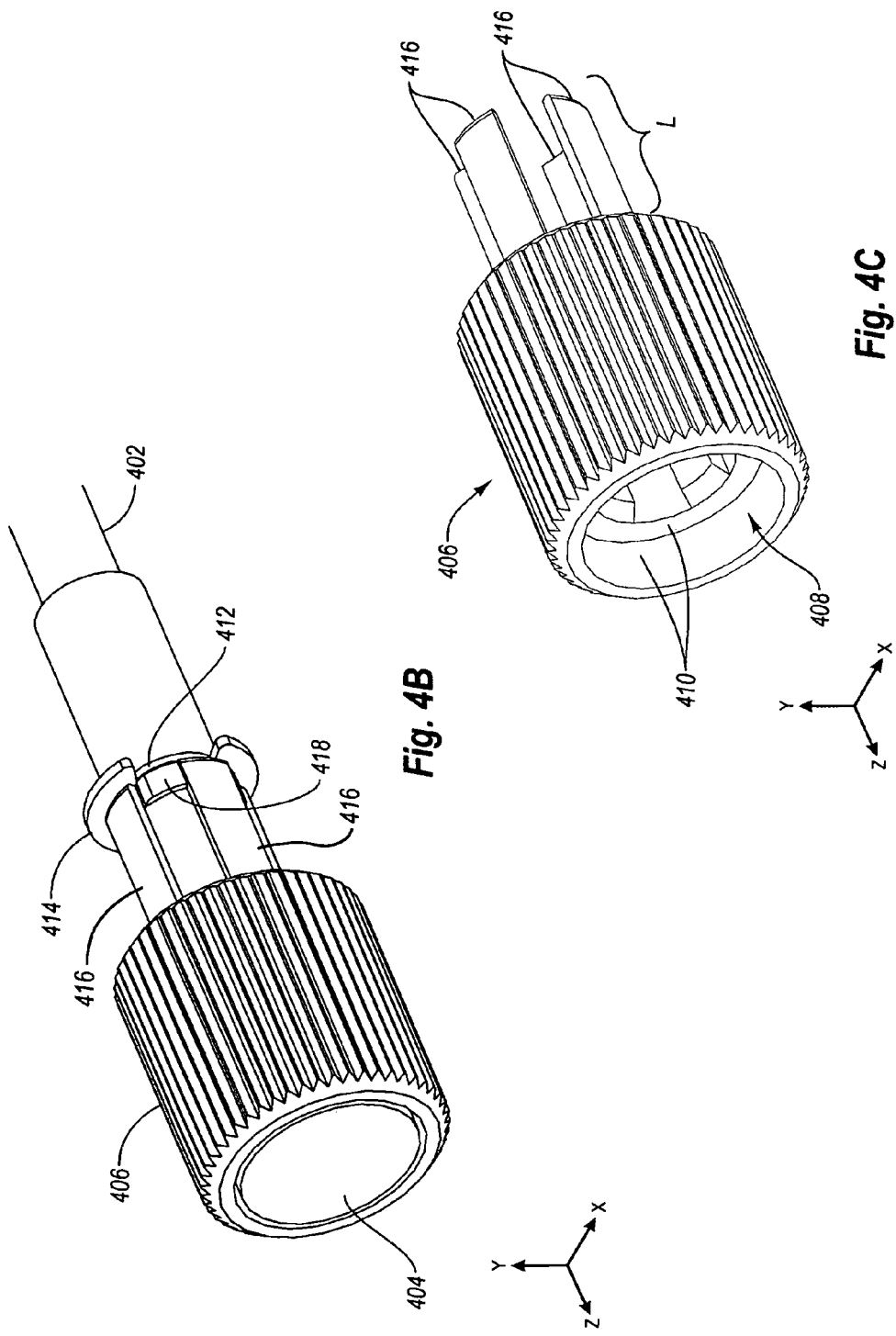

THUMBSCREW FOR PLUGGABLE MODULES

BACKGROUND OF THE INVENTION

1. The Field of the Invention

The present invention generally relates to pluggable electronic and optoelectronic modules and host devices. In particular, some example embodiments relate to thumbscrews for securing pluggable modules to host devices.

2. The Related Technology

Conventional mechanical platforms implemented in optical and electrical networks include a pluggable module configured to be plugged into a host device to convert electrical data signals to optical data signals and vice versa. Specific functionality, dimensions, and/or other functionality of such mechanical platforms are often standardized by a multi-source agreement ("MSA"), such as the X2 MSA, XPAK MSA, and/or XENPAK MSA, for example.

Traditional pluggable modules, including X2, XPAK, and XENPAK form-factor modules, include a narrow channel defined along opposite sides of the module that run the length of the module. Host devices include corresponding narrow guiderails. To plug such a module into a host device, the module channels are aligned with the host guiderails and the module is pushed into the host device, the module channels engaging the host guiderails to ensure proper alignment of the module within the host device. Once plugged in, a module connector in the back of the module and a host connector in the host device provide an electrical interface between the module and the host device.

Pluggable modules typically include a hard shell that can protect the internal components of the pluggable module from shock damage during handling, assembly, or the like. In some form-factors, however, a portion of the module connector extends outside the confines of the shell. The portion extending outside the confines of the shell can be susceptible to damage from shocks or impacts.

Additionally, some pluggable modules, like XENPAK form-factor modules, are secured in host devices by two short thumbscrews which engage threaded receptacles in the front panel of the host device. The thumbscrews typically rely on a human user to provide tightening torque via the thumbscrew head. Achieving consistent torque load for all thumbscrews can be difficult as different users may apply different torques to the thumbscrews. Thumbscrews that are over-tightened can be damaged or can cause damage to other components. Thumbscrews that are under-tightened can result in poor connections between the pluggable module and the host device.

To facilitate the use of thumbscrews, the module typically includes an oversize module front panel with two flanges that extend outward from opposing sides of the module, one thumbscrew being inserted through each flange. The flanges typically overlap a significant amount of the host front panel to provide enough metal for the thumbscrews to thread into. The overlap is increased by the requirement that the thumbscrews avoid the space behind the module front panel and the host front panel occupied by the module itself and the narrow guiderails of the host device.

As a result of the required overlap, the footprint of the module front panel and flanges extends significantly beyond the footprint of the main body of the module as viewed from the front of the module. Consequently, the maximum number of modules that can be plugged into a single host device is limited by the module front panel and flanges, and not by the main body of the module.

Further, the attachment of traditional pluggable modules to the front panel of the host device can make containment of electromagnetic interference ("EMI") at the back of the module difficult to achieve. Specifically, attaching the module to the front panel of the host device can result in a good EMI seal between the module flange and the host front panel. However, tolerance stack-up in the plugging direction results in a highly variable position of the module connector with respect to the host connector from one module to another such that a conventional elastomeric EMI gasket, which has a limited compression range, positioned between the back of the module and the host connector is inadequate for providing EMI containment.

Additionally, the tolerance stack-up is typically compensated for by increasing the length of contacts within the module connector and/or host connector. The increased contact length allows for greater variation in the position of the module connector with respect to the host connector. Additionally, however, the increased contact length increases EMI emissions of each lengthened contact and can result in large contact stubs that extend beyond the points of contact between contacts in the module connector and contacts in the host connector. The large stubs create inductive discontinuities that degrade high speed signal integrity and further exacerbate EMI emissions.

On the other hand, the back of the module can be secured directly to the host connector, rather than securing the module front panel directly to the host front panel, to improve the EMI seal at the interface between the back of the module and the host connector. Such an arrangement would additionally allow shorter contact lengths to be used in the module connector and host connector as tolerance stack-up would not be an issue at that interface. However, the tolerance stack-up would then have to be dealt with at the interface between the module front panel and the host front panel, preventing the module front panel from being directly secured to the host front panel and compromising the EMI seal at that interface.

Additionally, some MSAs specify belly-to-belly configurations where a first module is positioned on top of a host printed circuit board ("PCB") and a second module is positioned upside down on the bottom of the host PCB directly beneath the first module. In such a configuration, the two modules are usually separated by only a few millimeters, or little more than the thickness of the host PCB. The presence of the oversized module front panel in the X2, XENPAK and other pluggable modules precludes belly-to-belly configurations with these modules since the oversized module front panel prevents the modules from being positioned sufficiently close together.

The subject matter claimed herein is not limited to embodiments that solve any disadvantages or that operate only in environments such as those described above. Rather, this background is only provided to illustrate one exemplary technology area where some embodiments described herein may be practiced

BRIEF SUMMARY OF SOME EXAMPLE EMBODIMENTS

In general, example embodiments relate to pluggable modules that include thumbscrews or other features or aspects for protecting a connector of the pluggable module from damage and/or for ensuring consistent torque loads during installation in a host device.

In one example embodiment, a pluggable module comprises a shell, a module connector, and one or more thumbscrews. The shell defines a cavity within which a PCB and one or more components are disposed and includes a front, back, first side, and second side. The module connector is operatively connected to the PCB near the back of the shell and extends from within the cavity to outside the shell through an opening defined in the back of the shell. The module connector is configured to operatively couple the pluggable module to a host device. The thumbscrews are housed within one or more portions of the shell and are configured to threadably secure the pluggable module to the host device. Each of the thumbscrews comprises a torque limiter. The pluggable module can further comprise protecting means for protecting a portion of the module connector extending outside the cavity from damage.

In another example embodiment, a thumbscrew for securing a pluggable module to a host device comprises a head defining an opening. The thumbscrew further comprises a shaft defining a first end and a second end. The first end includes a threaded portion configured to threadably engage a tapped hole of the host device and the second end extends at least partially into the opening of the head. The thumbscrew further comprises a torque limiter that substantially prevents application of tightening torques that exceed a predetermined maximum torque to the shaft when the threaded portion threadably engages the tapped hole.

In yet another example embodiment, a thumbscrew for securing a pluggable module to a host device comprises a shaft, a threaded portion and a head. The shaft defines a first end and a second end oppositely disposed from the first end. The threaded portion is formed in the first end and is configured to threadably secure the pluggable module to the host device. The pluggable module includes a module connector configured to mate with a host connector of the host device. The head is disposed on the second end of the shaft and is configured to apply at least some torque applied to the head to the shaft. The first end of the shaft is configured to cooperate with a shell of the pluggable module to form a protective barrier for the module connector.

Additional features of the invention will be set forth in the description which follows, and in part will be obvious from the description, or may be learned by the practice of the invention. The features of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIGS. 2A-2C disclose one example embodiment of a pluggable module;

FIGS. 4A-4D disclose an example embodiment of a thumbscrew with integrated torque limiter that can be implemented to threadably secure a pluggable module to a host device;

DETAILED DESCRIPTION

The principles of the embodiments described herein describe the structure and operation of several examples used to illustrate the present invention. It should be understood that the drawings are diagrammatic and schematic representations of such example embodiments and, accordingly, are not limiting of the scope of the present invention, nor are the drawings necessarily drawn to scale. Well-known devices and processes have been excluded so as not to obscure the discussion in details that would be known to one of ordinary skill in the art.

Some example embodiments of the invention relate to pluggable modules that include thumbscrews or other features or aspects for protecting a connector of the pluggable module from damage and/or for ensuring consistent torque loads during installation in a host device. For instance, the thumbscrews can include a torque limiter to achieve consistent torque loads. Alternately or additionally, the thumbscrews can include an extension to form a protective barrier around the connector. Alternately or additionally, the pluggable modules can include extensions to form a protective barrier around the connector.

The embodiments disclosed herein may be implemented in various types of electronic and optoelectronic modules of various operating speeds and various form factors, including, but not limited to, the emerging 100G Form-factor Pluggable ("CFP") Multi-Source Agreement ("MSA") form factor. As used herein, the term "optoelectronic module" includes modules having both optical and electrical components. Examples of optoelectronic modules include, but are not limited to transponders, transceivers, transmitters, and/or receivers. Optoelectronic modules can be used, for instance, in telecommunications networks, local area networks, metro area networks, storage area networks, wide area networks, and the like.

I. Example Mechanical Platform

Figure 1:
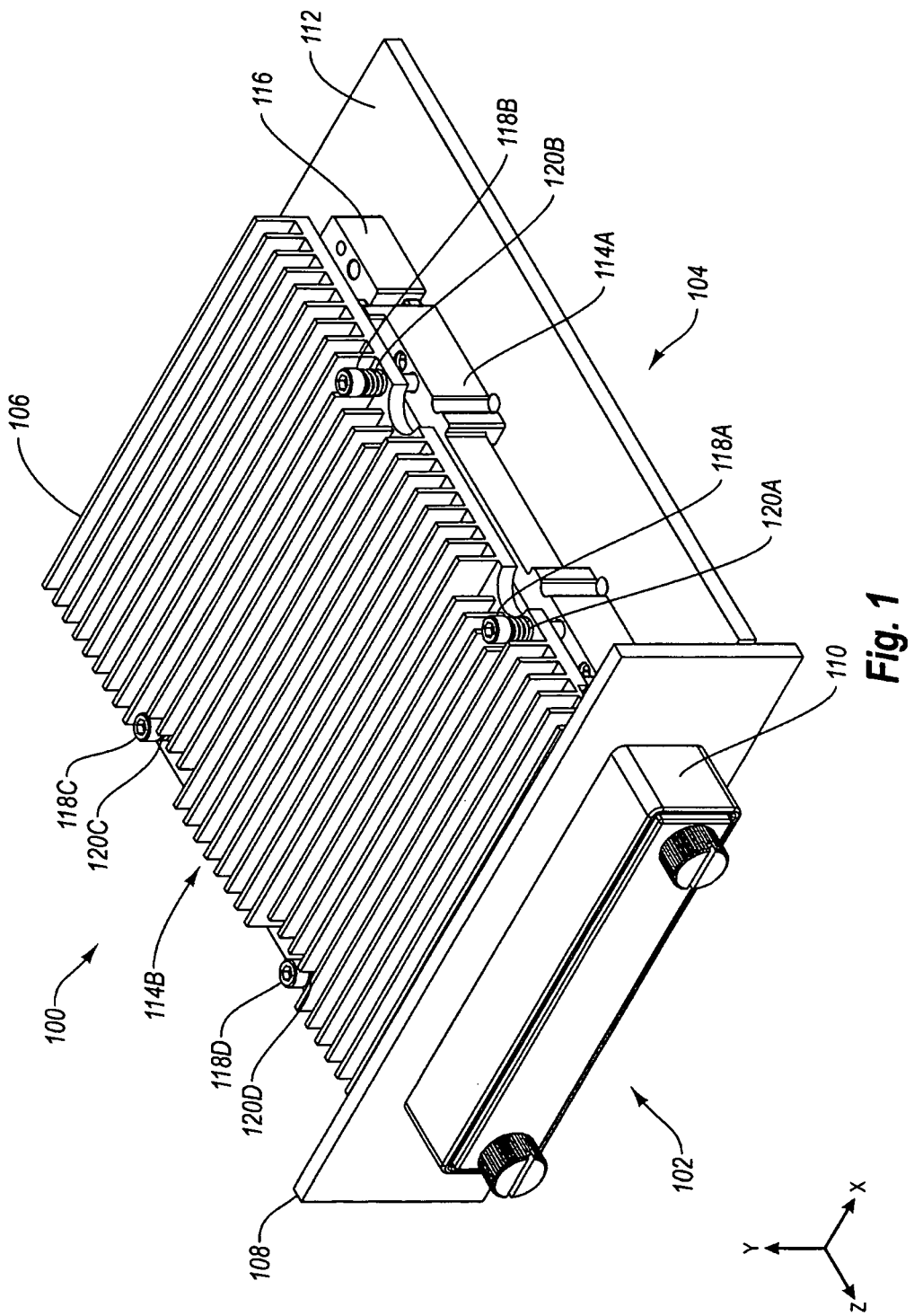
FIG. 1 discloses an example mechanical platform including a host device and a pluggable module.

With reference first to FIG. 1, an example mechanical platform 100 is disclosed according to some embodiments of the invention. The mechanical platform 100 includes a pluggable optoelectronic module 102 ("module 102") and a host device 104. The module 102 is configured to be plugged into the host device 104 as will be explained in more detail to follow.

The host device 104 includes a heatsink 106, front panel 108, host bezel assembly 110, host PCB 112, host guides 114A, 114B (not shown), and host connector 116. In some embodiments, a plurality of shoulder screws 118A-118D removably secure the heatsink 106 to the host device 104. Optionally, a compression spring 120A-120D can be circumferentially disposed about each of the shoulder screws 118A-118D, respectively. The compression springs 120A-120B are configured to bias the shoulder screws 118A-118D upwards (e.g., in the positive y-direction) away from the host guides 114A, 114B. When the shoulder screws 118A-118D are aligned with corresponding tapped holes on host guides 114A and 114B, a user can exert a downward force (e.g., in the negative y-direction) on shoulder screws 118A-118D to overcome the upward bias from compression springs 120A-120D to install the shoulder screws 118A-118D into the corresponding tapped holes on the host guides 114A and 114B. Once installed, the compression springs 120A-120D serve to bias the heatsink 106 against the top surface of the module 102. Although not shown, a thermal pad, thermal film, thermal gel, and/or other thermally conductive material can be placed between the module 102 and heatsink 106 to thermally couple the heatsink 106 to the module 102 and improve the ability of the heatsink 106 to receive and dissipate heat away from the module 102.

II. First Example Pluggable Module

Figure 2A:
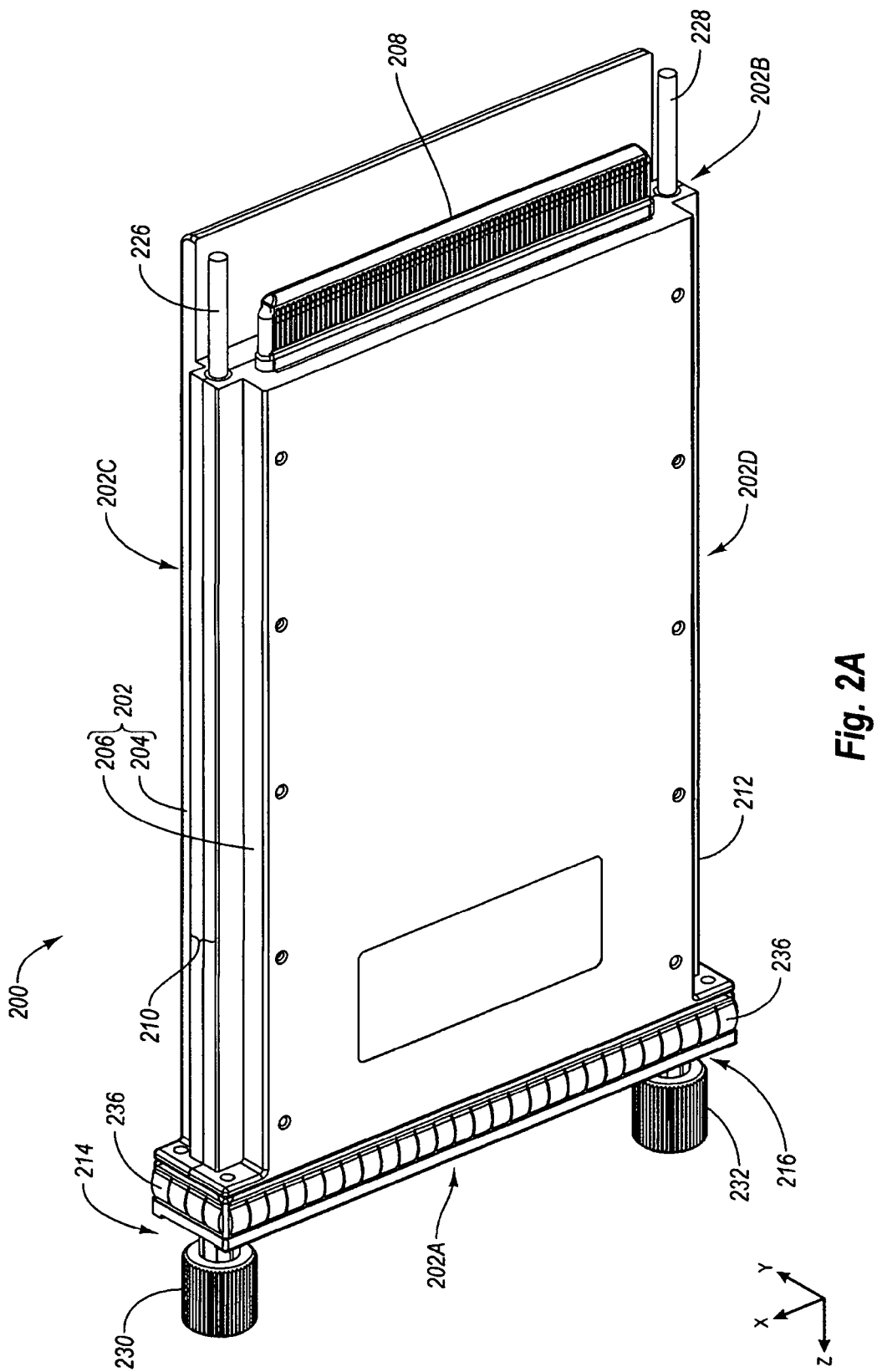
Figure 2B:
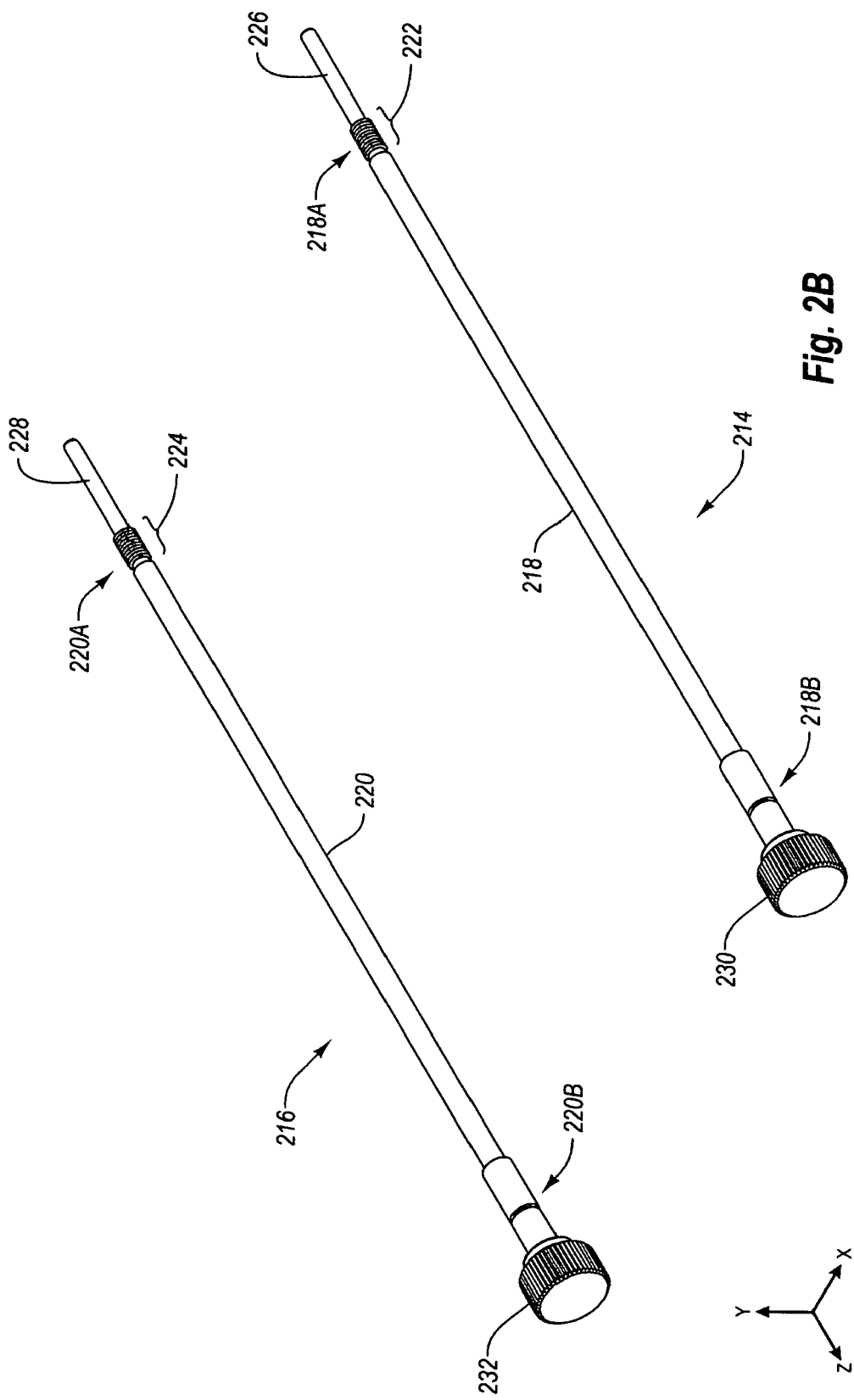

With additional reference to FIGS. 2A-2C, aspects of a first example pluggable module 200 ("module 200") are disclosed. The module 200 may correspond to the module 102 of FIG. 1. As shown, the module 200 includes a shell assembly 202 comprising top shell 204 and bottom shell 206. Alternately, a monolithic shell can be implemented instead of a shell assembly 202. The top and/or bottom shell 204, 206 can be made using any reasonable material known in the art. The shell assembly 202 includes a front 202A, back 202B, first side 202C, and second side 202D.

The shell assembly 202 defines a cavity within which a module PCB (not shown) is disposed. One or more electronic, optical, and/or optoelectronic components can be coupled to the module PCB and disposed within the cavity, including a transmitter optical subassembly ("TOSA"), receiver optical subassembly ("ROSA"), laser driver, post amplifier, controller, or the like or any combination thereof.

A module connector 208 is operatively coupled to the module PCB and extends from within the cavity defined by the shell assembly 202 to outside the shell assembly 202 through an opening defined in the back 202B of the shell assembly 202. The module connector 208 is configured to mate with a corresponding host connector, such as the host connector 116 of FIG. 1, when the module 200 is plugged into a host device and to operatively couple the module 200 to the host device.

Guiderails 210, 212 protrude laterally at the junction of the top shell 204 and bottom shell 206 from opposite sides 202C, 202D of the module 200 and extend along the length of the module 200. However, it is not required that the guiderails 210, 212 protrude laterally at the junction of the top shell 204 and bottom shell 206. For instance, the guiderails 210, 212 can protrude from opposite sides 202C, 202D of the module 200 above or below the junction of the top and bottom shells 204, 206 or from opposite sides of a module that includes a monolithic shell rather than a shell assembly 202. The guiderails 210, 212 are configured to engage channels on a host bezel assembly 110 (FIG. 1) and host guides 114A, 114B (FIG. 1), as will be discussed in more detail below.

Thumbscrews 214 and 216 are housed within guiderails 210, 212 and protrude through the front 202A of the shell assembly 202 and extend along the full length of the module 200. The thumbscrews 214 and 216 are configured to threadably secure the module 200 to a host device in which the module 200 is received. In some embodiments, each of the thumbscrews 214, 216 comprise hardened steel. Alternately or additionally, each of the thumbscrews 214, 216 can be configured to absorb impact forces to protect the module connector 208 during handling, assembly, or the like.

As shown in FIG. 2B, thumbscrew 214 comprises a shaft 218 defining a first end 218A and a second end 218B. Similarly, thumbscrew 216 comprises a shaft 220 defining a first end 220A and a second end 220B. Each of the first ends 218A, 220A includes a threaded portion 222, 224, respectively, formed thereon. The threaded portions 222, 224 are configured to threadably secure the pluggable module 200 to a host device.

As shown in FIG. 2B, each of the first ends 218A, 220A further includes an extension 226, 228, respectively, configured to cooperate with the bottom shell 206 to form a protective barrier for the module connector 208, as depicted in FIG. 2A. As such, the extensions 226, 228 serve as one example of a structural implementation of a means for protecting a portion of the module connector 208 extending outside the cavity of the shell assembly 202 from damage.

Turning back to FIG. 2B, each of the second ends 218B, 220B includes a head 230, 232 disposed on the second end 218B, 220B, respectively, and configured to extend outside of shell assembly 202 so as to be accessible to a user, as depicted in FIG. 2A. In the example of FIG. 2B, the heads 230, 232 are integrally formed with the shafts 218, 220 at the second ends 218B, 220B. As such, the heads 230, 232 are configured to apply torques to the shafts 218, 220 in response to torques applied to the heads 230, 232. Alternately, the heads 230, 232 can be separable from the shafts 218, 220. Optionally, one or both of thumbscrews 214, 216 can include a torque limiter, as will be discussed in more detail with respect to FIGS. 4A-4D.

During assembly and handling of pluggable modules, the pluggable modules can be subjected to various impact forces. Conventional pluggable modules having a module connector that extends outside the shell of the conventional pluggable module can be damaged from such impact forces. For instance, depending on the magnitude and location of the impact, the module connector in a conventional pluggable module can partially or completely decouple from the module PCB, or can be chipped, cracked, or otherwise damaged from the impact.

According to some embodiments of the invention, however, the module 200 can include thumbscrews 214, 216 comprising extensions 226, 228 which extend outwardly beyond the back end of the module connector 208. As best seen in FIGS. 2A and 2C, the extensions 226, 228 cooperate with the bottom shell 206 to form a protective barrier for the module connector 208.

The protective barrier is generally designated in FIG. 2C by reference line 234. The region inside the protective barrier 234, including the module connector 208, can be protected against various impact forces by the extensions 226, 228 and bottom shell 206. For instance, the extensions 226, 228 and bottom shell 206 can protect the module connector 208 against flat impact forces near the back 202B of module 200 from substantially planar surfaces. In particular, any substantially planar surface that is wider than the distance between the corner of the bottom shell 206 and the ends of the extensions 226, 228 forming the protective barrier 234 cannot cross the protective barrier 234. Instead, any impact against such a substantially planar surface can be absorbed by the extensions 226, 228 and/or bottom shell 206. Alternately or additionally, the extensions 226, 228 and bottom shell 206 can be configured to protect the module connector 208 against other types of impact forces.

In some embodiments, a compression spring (not shown) can be circumferentially disposed about each thumbscrew 214, 216 and housed within guiderail 210, 212, respectively. The compression springs can be configured to bias the thumbscrews 214, 216 in an outward position as shown in FIGS. 2A and 2C, which may be approximately 6 millimeters ("mm") in some embodiments. Prior to plugging the module 200 into a host device, the threaded portions 222, 224 of thumbscrews 214, 216 can be retracted into the guiderails 210, 212 due to the outward bias force exerted by the compression springs. However, even if the thumbscrews 214, 216 are outwardly biased by compression springs, the extensions 226, 228 can be sufficiently long to form the protective barrier 234 for the module connector 208 with the bottom shell 206.

Returning to FIG. 2A, the module 200 additionally includes an EMI collar 236 surrounding the front 202A of the module 200. The EMI collar 236 operates in conjunction with a host bezel assembly to create an EMI shield around the front 202A of the module 200 when plugged into a host device.

Optionally, the top shell 204 of module 200 can include an integrated low profile heatsink for low profile, low power applications.

Additional aspects regarding example pluggable modules that can be implemented in CFP and other mechanical platforms are disclosed in U.S. patent application Ser. No. 12/203,027, filed Sep. 2, 2008 and entitled CFP MECHANICAL PLATFORM (referred to herein as "the '027 application"). The '027 application is herein incorporated by reference in its entirety.

III. Second Example Pluggable Module

Figure 3A:
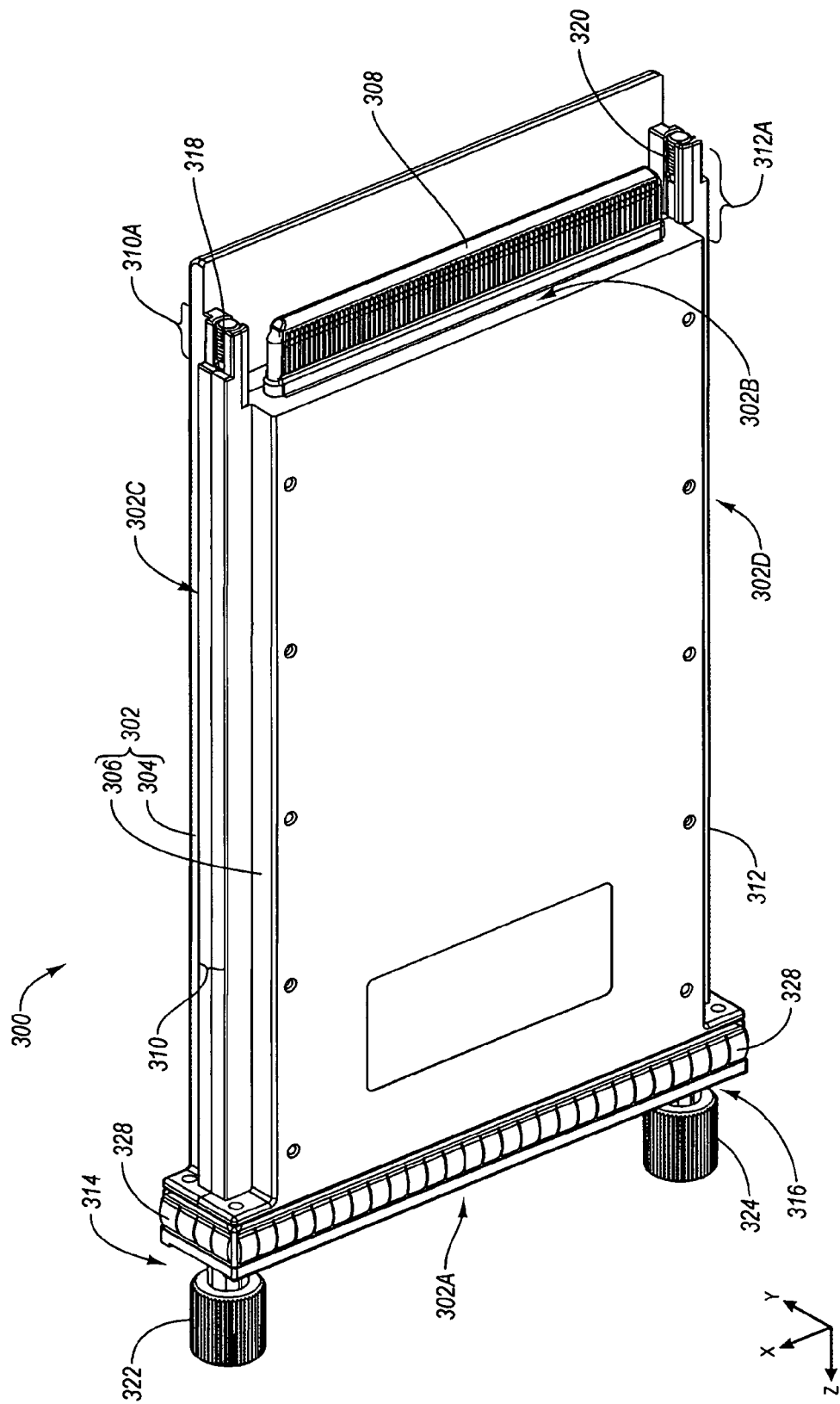
FIGS. 3A and 3B disclose another example embodiment of a pluggable module.
Figure 3B:
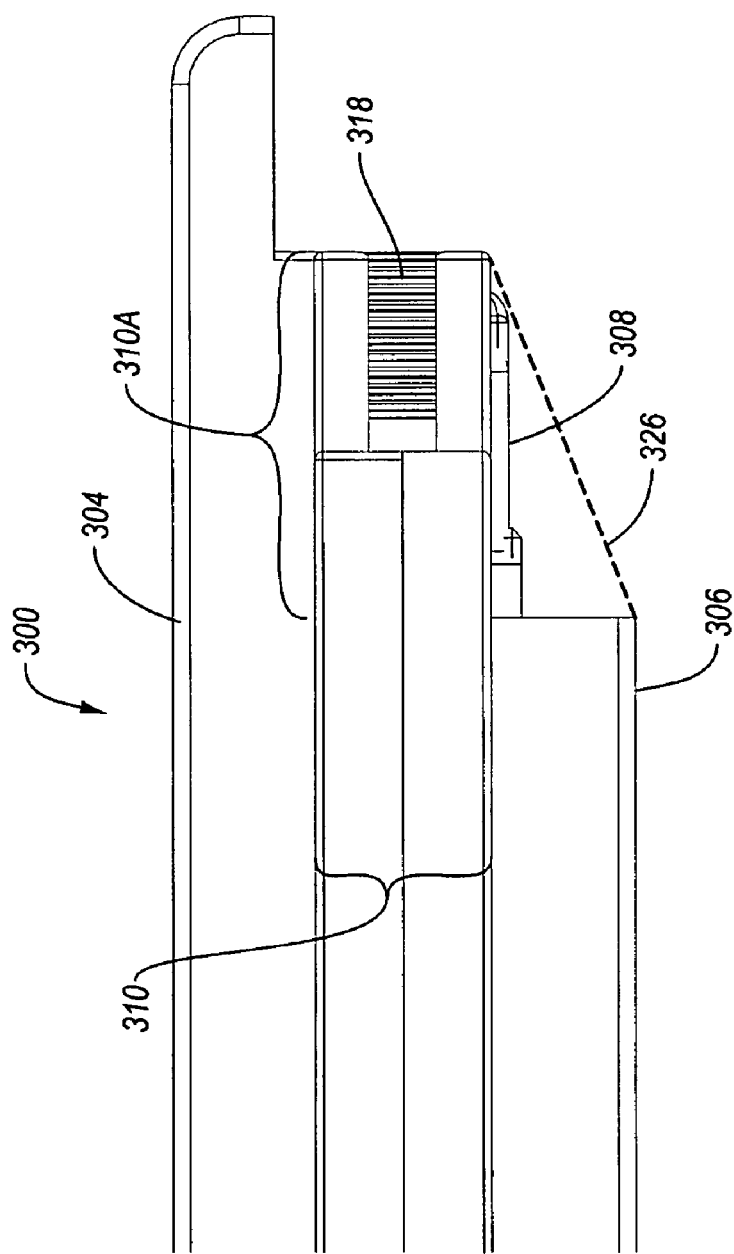

Turning now to FIGS. 3A and 3B, aspects of a second example pluggable module 300 ("module 300") are disclosed. The module 300 may correspond to the module 102 of FIG. 1. The module 300 is similar in some respects to the module 200 of FIG. 2 and includes a shell assembly 302 comprising top shell 304 and bottom shell 306. Alternately, module 300 can include a monolithic shell. The shell assembly 302 includes a front 302A, back 302B, first side 302C, and second side 302D. The shell assembly 302 defines a cavity within which a module PCB (not shown) and one or more components (not shown) are disposed.

A module connector 308 is operatively coupled to the module PCB and extends from within the cavity defined by the shell assembly 302 to outside the shell assembly 302 through an opening defined in the back 302B of the shell assembly 302. The module connector 308 is configured to mate with a corresponding host connector, such as the host connector 116 of FIG. 1, when the module 300 is plugged into a host device and to operatively couple the module 300 to the host device.

Guiderails 310, 312 protrude laterally at the junction of the top shell 304 and bottom shell 306 from opposite sides 302C, 302D of the module 300 and extend along the length of the module 300. However, it is not required that the guiderails 310, 312 protrude laterally at the junction of the top shell 304 and bottom shell 306. The guiderails 310, 312 are configured to engage channels on a host bezel assembly 110 (FIG. 1) and host guides 114A, 114B (FIG. 1), as will be discussed in more detail below.

Thumbscrews 314 and 316 are housed within guiderails 310, 312 and protrude through the front 302A of the shell assembly 302 and extend along the full length of the module 300. The thumbscrews 314 and 316 are configured to threadably secure the module 300 to a host device in which the module 300 is received. In some embodiments, each of the thumbscrews 314, 316 comprise hardened steel. Optionally, a compression spring (not shown) can be circumferentially disposed about each thumbscrew 314, 316 and housed within guiderail 310, 312, respectively, to bias thumbscrews 314, 316 in an outwards position prior to plugging the module 300 into a host device.

Each thumbscrew 314, 316 includes a shaft defining a first end and a second end, with a threaded portion 318, 320 formed in the shaft at the first end and a head 322, 324 disposed on the shaft at the second end. The head 322, 324 can be integrally formed with the shaft of each thumbscrew 314, 316, or separable from each shaft. Optionally, one or both of the thumbscrews 314, 316 can include a torque limiter, as will be discussed in more detail with respect to FIGS. 4A-4D.

To protect the module connector 308 from impact forces according to some embodiments of the invention, each of guiderails 310, 312 can include an extension 310A, 312A extending outwardly beyond the back end of the module connector 308. In some embodiments, the extensions 310A, 312A can partially surround portions of thumbscrews 314, 316 housed therein. Alternately, the extensions 310A, 312A can completely surround portions of thumbscrews 314, 316 housed therein.

The extensions 310A, 312A cooperate with the bottom shell 306 to form a protective barrier for the module connector 308. As such, the extensions 310A, 312A serve as a second example of a structural implementation of a means for protecting a portion of the module connector 308 extending outside the cavity of the shell assembly 302 from damage.

The protective barrier formed by extensions 310A, 312A and bottom shell 306 is generally designated in FIG. 3B by reference line 326. Analogous to the explanation given above with respect to FIG. 2C, the region inside the protective barrier 326, including the module connector 308, can be protected against various impact forces by the extensions 310A, 312A and bottom shell 306. For instance, the extensions 310A, 312A and bottom shell 306 can protect the module connector 308 against flat impact forces near the back 302B of module 300 from substantially planar surfaces. Alternately or additionally, the extensions 310A, 312A and bottom shell 306 can be configured to protect the module connector 308 against other types of impact forces.

Returning to FIG. 3A, the module 300 additionally includes an electromagnetic interference ("EMI") collar 328 surrounding the front 302A of the module 300. The EMI collar 328 operates in conjunction with a host bezel assembly to create an EMI shield around the front 302A of the module 300 when plugged into a host device. Optionally, the top shell 304 of module 300 can include an integrated low profile heatsink for low profile, low power applications.

IV. Thumbscrew Torque Limiter

With additional reference to FIGS. 4A-4D, an example embodiment of a thumbscrew 400 with integrated torque limiter is disclosed. Embodiments of the example thumbscrew 400 can be implemented in the modules 102, 200, 300 of FIGS. 1, 2A, and 3A, for instance, or in other pluggable modules or other environments altogether.

Figure 4A:
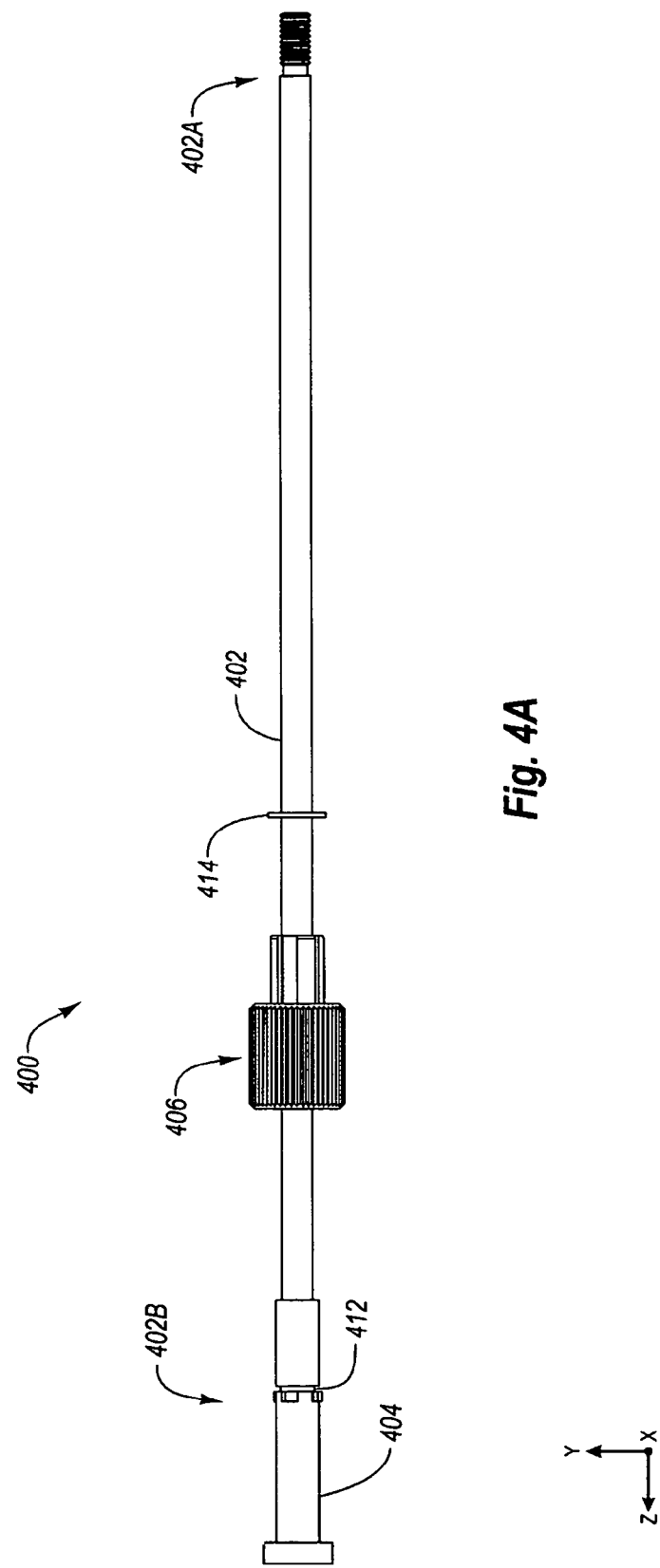

FIG. 4A discloses an exploded view of thumbscrew 400 and FIG. 4B discloses a perspective view of one end of the thumbscrew 400 with the pieces shown in FIG. 4A fully assembled. As shown in FIG. 4A, the thumbscrew 400 comprises a shaft 402 defining a first end 402A and a second end 402B oppositely disposed from the first end 402A. The first end 402A can include a threaded portion configured to threadably secure a pluggable module in which the thumbscrew 400 is implemented to a host device. For instance, the threaded portion of first end 402A can threadably engage a tapped hole of the host device. As used herein, "tapped hole" refers to a through-hole or a cavity that contains internal threads.

The second end 402B can include a shaft head 404. The thumbscrew 400 further comprises a screw head 406 that is slidable along the shaft 402 to engage the shaft head 404 at the second end 402B of the shaft 402. As shown in FIG. 4C, the screw head 406 defines an opening 408 configured to receive head 404 of the shaft 402. In particular, the second end 402B of shaft 402 can at least partially extend into the opening 408, as shown in FIG. 4B. In some embodiments, the screw head 406 includes a stepped bezel 410 configured to engage the shaft head 404 to substantially prevent the screw head 406 from moving in the positive z-direction with respect to the shaft 402 when the thumbscrew 400 is fully assembled.

One or both of the shaft 402 and screw head 406 can comprise injection molded metal, forged metal, machine turned metal, broached metal, or the like or any combination thereof.

Optionally, as shown in FIGS. 4A and 4B, the thumbscrew 400 can further comprise a notch 412 formed in the shaft 402, and a retaining clip 414. The retaining clip 414 can cooperate with the notch 412 to substantially confine the second end 402B of the shaft 402 within the opening 408 of the screw head 406. During assembly, the first end 402A of the shaft 402 is inserted into the screw head 406. The screw head 406 is slid along shaft 402 to the second end 402B. The shaft head 404 can substantially prevent the screw head 406 from moving in the positive z-direction, while the notch 412 and retaining clip 414 can substantially prevent the screw head 406 from moving in the negative z-direction.

The thumbscrew 400 further comprises a torque limiter that substantially prevents application of tightening torques that exceed a predetermined maximum torque to the shaft when the threaded portion of the first end 402A threadably engages a tapped hole of a host device. As used herein, "tightening torque" refers to a torque that tends to tighten a screw or other threaded fastener into a device having a tapped hole. The tightening torque may be clockwise or counterclockwise, depending on whether the threaded portion on the first end 402A of thumbscrew 400 includes clockwise or counterclockwise threads.

Generally, the torque limiter of thumbscrew 400 can include one or more components integrally formed in the shaft 402, screw head 406, or both. Alternately or additionally, the torque limiter of thumbscrew 400 can include one or more components that are separate from the shaft 402 and screw head 406.

In some embodiments, the torque limiter of thumbscrew 400 includes one or more cantilever springs 416 extending from the base of screw head 406, as seen in FIG. 4C, and one or more cams 418 radially protruding from the second end 402B of the shaft 402, as seen in FIG. 4B. The cantilever springs 416 are configured to selectively engage the cams 418 and apply a tightening torque applied to the screw head 406 to the shaft 402 depending on whether the tightening torque applied to the screw head exceeds the predetermined maximum torque.

Accordingly, when the tightening torque applied to the screw head 406 is less than or equal to the predetermined maximum torque, the cantilever springs 416 can engage the cams 418 and apply the tightening torque to the shaft 402. In contrast, when the tightening torque applied to the screw head 406 exceeds the predetermined maximum torque, the cantilever springs disengage from the cams and do not apply the tightening torque to the shaft 402.

Figure 4D:
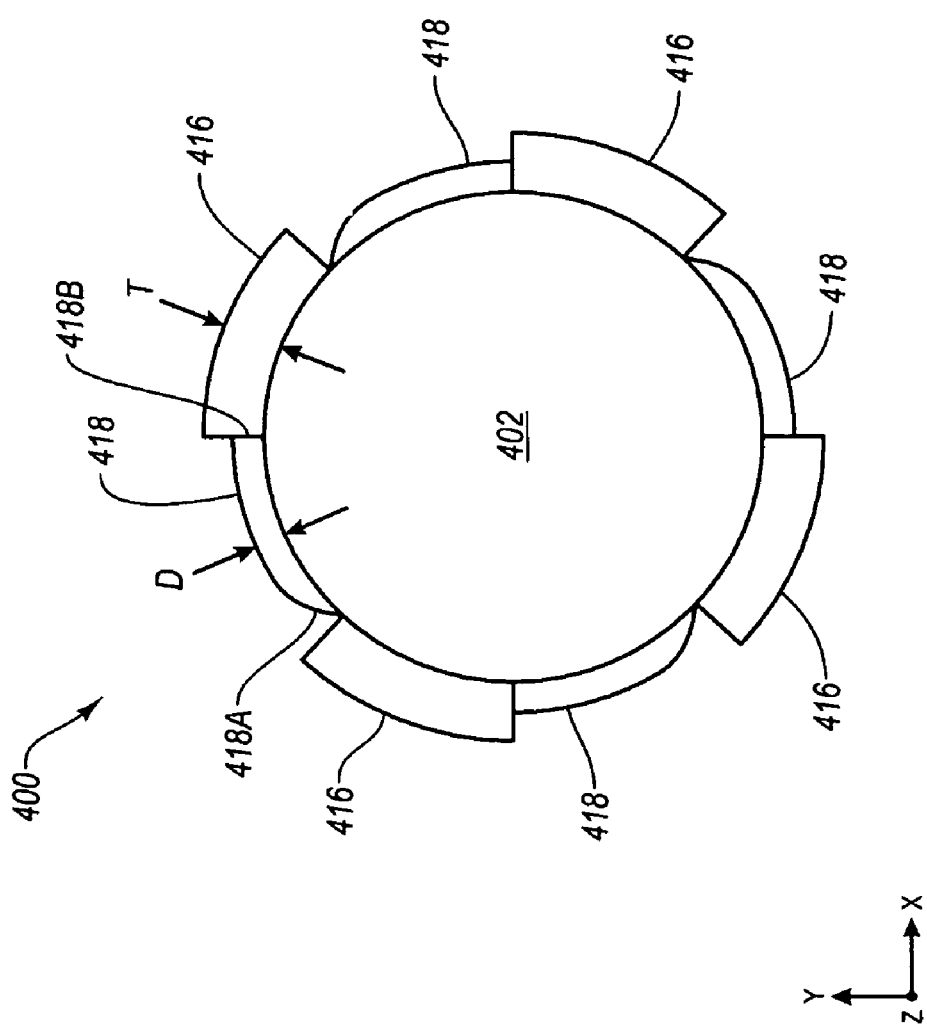

With additional reference to FIG. 4D, a simplified cross-section of the thumbscrew 400 is disclosed that omits the retaining clip 414. In the embodiment of FIG. 4D, the thumbscrew 400 includes four cantilever springs 416 and four cams 418. Alternately or additionally, the thumbscrew 400 can include as few as one cantilever spring and one cam, or more than four cantilever springs and four cams.

In some embodiments, the predetermined maximum torque of the torque limiter may depend on the quantity of cantilever springs and cams included in the thumbscrew 400. Accordingly, thumbscrew designers may select a specific number of cantilever springs and cams to include in a thumbscrew design based on a desired predetermined maximum torque.

With continuing reference to FIG. 4D, each of the cams 418 comprises a lead-in feature 418A and is characterized by a distance D that the cam 418 radially protrudes from the second end 402B of the shaft 402. Each of the lead-in features 418A can have a positive shape, meaning the lead-in features 418A slope away from the adjacent cantilever spring 416 to facilitate disengaging the cantilever springs 416 from the cams 418 when the tightening torque exceeds the predetermined maximum torque.

Upon application of a tightening torque, e.g., a clockwise torque in the example of FIGS. 4A-4D, to the screw head 406, the cantilever springs 416 extending from the base of the screw head 406 engage the lead-in features 418A of each cam 418 when the tightening torque is less than the predetermined maximum torque and apply the torque to the shaft 402. However, when the tightening torque exceeds the predetermined maximum torque, the cantilever springs 416 can resiliently deflect up and over adjacent lead-in features 418A to disengage from the cams 418.

Further, each cam 418 can additionally comprise a trailing feature 418B oppositely disposed from the lead-in feature 418A. Each of the trailing features 418B can have a shape that is more negative than the shape of the lead-in features, meaning the trailing features 418B slope more towards the adjacent cantilever spring 416 than the lead-in features 418A. The more negative shape of the trailing features 418B allows stronger torques to be applied in the loosening direction than in the tightening direction.

Upon application of a loosening torque, e.g., a counter clockwise torque in the example of FIGS. 4A-4D, to the screw head 406, the cantilever springs 416 engage the trailing features 418B of each cam 418 and apply the loosening torque to the shaft 402 to loosen the thumbscrew 400. As used herein, "loosening torque" is the opposite of "tightening torque" and refers to a torque that tends to loosen a screw or other threaded fastener out from a device having a tapped hole.

In the example of FIG. 4D, the loosening torque can exceed the predetermined maximum torque in magnitude due to the negative shape of the trailing features 418B. Accordingly, the torque limiter of thumbscrew 400 can function to limit torque in only the tightening direction, without limiting torque in the loosening direction in some embodiments.

As already mentioned above, the predetermined maximum torque of the torque limiter may depend on the quantity of cantilever springs 416 and cams 418 included in the thumbscrew 400. Alternately or additionally, the predetermined maximum torque may depend on one or more of the length L (FIG. 4C) of each cantilever spring 416, the thickness T (FIG. 4D) of each cantilever spring 416, the material(s) the cantilever springs 416 are made of, the quantity of the cantilevers springs 416, the coefficient of static friction between the cantilever springs 416 and cams 418, the distance D (FIG. 4D) that each cam 418 radially protrudes from the second end 402B of shaft 402, the shape of the lead-in features 418A, the coefficient of static friction between the cams 418 and the cantilever springs 416, or the like or any combination thereof. Thumbscrew designers can therefore engineer a thumbscrew for a desired predetermined maximum torque by appropriately selecting one or more of: the length L and/or thickness T of the cantilever springs 416, the material(s) the cantilever springs 416 are made of, the quantity of the cantilever springs 416, the coefficient of static friction between the cantilever springs 416 and cams 418, the distance D of each cam 418, the shape of the lead-in features 418A, or the coefficient of static friction between the cams 418 and the cantilever springs 416.

The thumbscrew 400 can optionally include an extension formed in the first end 402A, such as extension 226 of FIG. 2A, for use in protecting a module connector of a pluggable module in which the thumbscrew 400 is implemented. Accordingly, the thumbscrew 400 can be implemented in the module 200 of FIG. 2A. Alternately or additionally, the thumbscrew 400 can be implemented in the module 300 of FIG. 3A in conjunction with guides 310, 312 having extensions 310A, 312A for protecting module connector 308. Alternately or additionally, the thumbscrew 400 can be implemented in other pluggable modules or other environments altogether.

V. Host

Returning briefly to FIG. 1, and as already mentioned, the host device 104 of FIG. 1 includes a front panel 108, host bezel assembly 110, host PCB 112, host guides 114A, 114B, and host connector 116. Briefly, the front panel 108 defines an opening configured to receive the module 102 in a plugging direction. As used herein, "plugging direction" refers to the direction in which the module 102 is plugged into the host device 104. In the example of FIG. 1, the plugging direction corresponds to the negative z-direction.

A. Host Bezel Assembly

Figure 5:
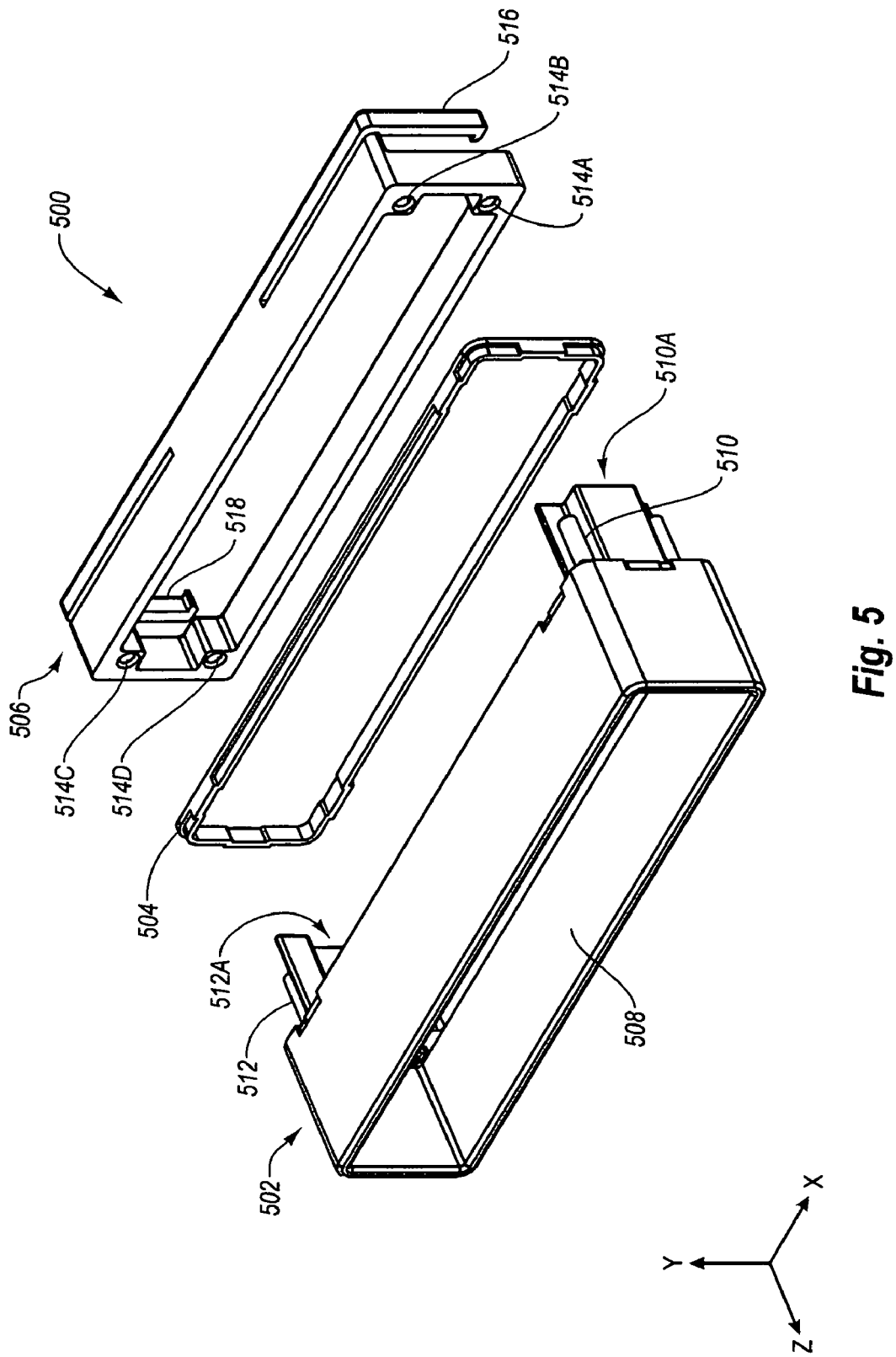
FIG. 5 discloses an example host bezel assembly that can be implemented in the host device of FIG. 1.

Turning briefly to FIG. 5, one example of a host bezel assembly 500 is disclosed that may correspond to the host bezel assembly 110 of FIG. 1. FIG. 5 illustrates an exploded perspective view of host bezel assembly 500. The host bezel assembly 500 of FIG. 5 includes a front bezel 502, EMI gasket 504, and rear bezel 506. The host bezel assembly 500 defines an opening through which a pluggable module can be plugged into a host device.

The front bezel 502 includes a rim 508. An EMI collar (e.g., EMI collar 236, 328 of FIG. 2A or 3A) of a pluggable module inserted through the host bezel assembly 500 is configured to contact the interior surface of the rim 508 in a wiping motion to form an EMI shield at the front of the pluggable module.

The front bezel 502 further includes a plurality of front bezel guides 510, 512, each front bezel guide including a guide channel 510A, 512A, respectively. The front bezel guides 510, 512, and more specifically, the guide channels 510A, 512A, are configured to receive guiderails of a pluggable module. For instance, guide channel 510A can receive guiderail 210 of module 200 (FIG. 2A) or guiderail 310 of module 300 (FIG. 3A), while guide channel 512A can receive guiderail 212 of module 200 or guiderail 312 of module 300. The front bezel guides 510, 512 are configured to extend through the EMI gasket 504 and rear bezel 506.

A plurality of through-holes (not shown) are formed at the four inside corners of the front bezel 502 where the rim 508 joins the front bezel guides 510, 512. The rear bezel 506 includes a corresponding plurality of through-holes 514A-514D. The front bezel 502 through-holes (not shown) and rear bezel 506 through-holes 514A-514D are configured to receive fasteners for coupling the front bezel 502 to the rear bezel 506 through a host front panel, such as front panel 108 of FIG. 1.

The rear bezel 506 further includes portions 516, 518 that are configured to be engaged by hook features on corresponding host guides to partially secure the host guides to the bezel assembly 500.

In some embodiments, the host bezel assembly 500 allows a host PCB to float. For instance, with combined reference to FIGS. 1 and 5, the host bezel assembly 500 can allow the host PCB 112, to float with respect to the front panel 108 in the plugging direction while remaining aligned with the front panel 108 in directions normal to the plugging direction, e.g., in the x- and y-directions. Additional aspects regarding host bezel assemblies that can be implemented in CFP and other mechanical platforms are disclosed in U.S. patent application Ser. No. 12/273,069, filed Nov. 18, 2008 and entitled FLOATING FRONT ENCLOSURE FOR PLUGGABLE MODULE (referred to herein as "the '069 application"). The '069 application is herein incorporated by reference in its entirety.

Alternately or additionally, a unitary host bezel can be implemented in the host device 104 of FIG. 1, rather than a host bezel assembly 110 or 500. According to this embodiment, the unitary host bezel can include through-holes for receiving fasteners for securing corresponding host guides directly to the unitary host bezel. Additional aspects regarding example unitary host bezels that can be implemented in CFP and other mechanical platforms are disclosed in the '027 application.

B. Host Guide

Figure 6:
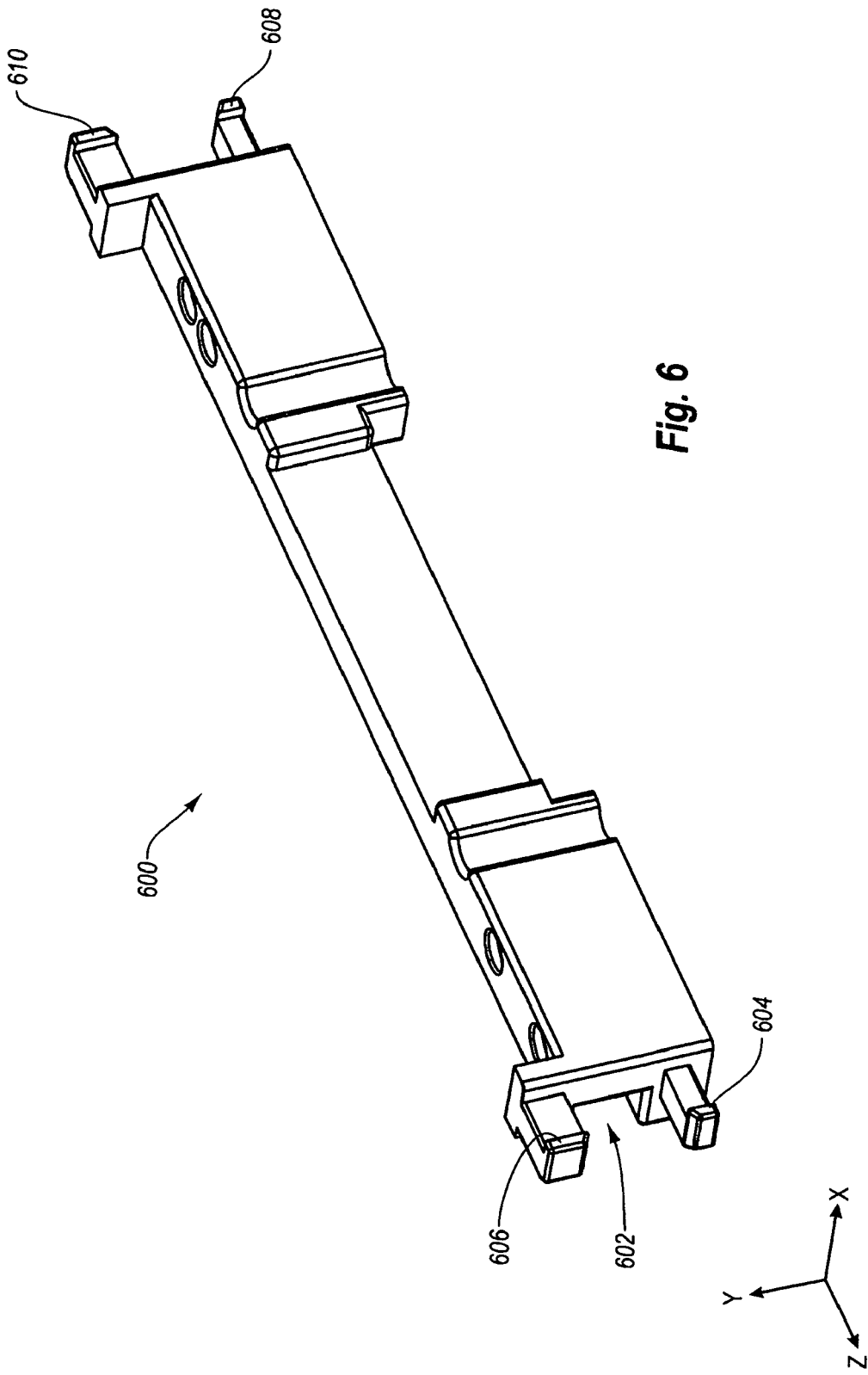
FIG. 6 discloses an example host guide that can be implemented in the host device of FIG. 1.

Turning briefly to FIG. 6, one example of a host guide 600 is disclosed that may correspond to one or both of the host guides 114A, 114B of FIG. 1. The host guide 600 is configured to guide a pluggable module when plugged into a host device in which the host guide 600 is implemented and can include a channel 602 configured to receive a guiderail of the pluggable module. For instance, when host guide 600 is implemented as host guide 114A of FIG. 1, the channel 602 can receive the guiderail 210 of module 200 (FIG. 2A) or the guiderail 310 of module 300 (FIG. 3A). Alternately, when host guide 600 is implemented as host guide 114B of FIG. 1, the channel 602 can receive the guiderail 212 of module 200 (FIG. 2A) or the guiderail 312 of module 300 (FIG. 3A).

The host guide 600 is configured to be rigidly secured to a host PCB and to be used in belly-to-belly configurations with itself. Further, the host guide 600 can be configured to float with respect to a corresponding host bezel assembly. For instance, the host guide 600 includes a plurality of hook features 604, 606, 608, 610 configured to engage corresponding portions of a host bezel assembly, e.g., portions 516 and 518 of the host bezel assembly 500 of FIG. 5. When host guide 600 is implemented as host guide 114A of FIG. 1, hook features 604, 606 are configured to engage the portion 516 of host bezel assembly 500 of FIG. 5. When host guide 600 is implemented as host guide 114B of FIG. 1, hook features 608, 610 are configured to engage the portion 518 of host bezel assembly 500 of FIG. 5.

Basically, the hook features 604-606 or 608-610 ensure that a portion of the host guide 600, e.g. the hook features 604-606 or 608-610, remain disposed within the opening defined by the host bezel assembly, while still allowing the host guide 600 and the host PCB to float with respect to the host bezel assembly in the plugging direction. By ensuring that a portion of the host guide 600 remains in the opening defined by the host bezel assembly, the host guide 600 and host PCB can maintain alignment with the host bezel assembly in directions normal to the plugging direction.

Alternately or additionally, host guides can be implemented that are rigidly secured to a host bezel assembly and host PCB in a host device in which the host guide is implemented.

Additional aspects regarding example host guides that can be implemented in CFP and other mechanical platforms are disclosed in the '027 application and the '069 application.

C. Host Connector

With combined reference to FIGS. 2A-2C and 7A, one example of a host connector 700 is disclosed that may correspond to the host connector 116 of FIG. 1. In some embodiments, the host connector 700 can be implemented with the module 200 of FIG. 2A. The host connector 700 can be coupled to a host PCB of a host device in which the host connector 700 is implemented and is configured to provide an electrical interface between module 200 and the host PCB. As shown in FIG. 7, the host connector 700 includes a connector core 702 defining a recessed slot for receiving module connector 208, a one-piece connector cover 704 defining a cavity configured to receive the connector core 702, and a plurality of EMI gaskets 706, 708, one each disposed on a front face and bottom face of the connector cover 704 to form EMI shields at interfaces of the host connector 700 with the module 200 and host PCB.

Each of the connector core 702 and connector cover 704 can include one or more posts 710, 712, 714 configured to be received in through-holes on the host PCB for properly aligning the connector core 702 and connector cover 704 with the host PCB during assembly. The connector core 702 includes a plurality of contacts 716 configured to be electrically coupled to contact pads of the host PCB. The contacts 716 can be partially enclosed within a plurality of chicklets, each chicklet enclosing two contacts 716 in some embodiments. The chicklets can include cutaway profiles to provide solder joint visibility during assembly.

A plurality of asymmetrically positioned through-holes 718A, 718B and asymmetrically positioned tapped holes 720A, 720B can be defined in the connector cover 704 to allow the host connector 700 to be used in belly-to-belly configurations with duplicates of itself. The connector cover 704 further includes a second plurality of tapped holes 722A, 722B configured to receive threaded portions 222, 224 of thumbscrews 214, 216 for threadably securing the module 200 directly to the host connector 700.

In some embodiments, the front face of connector cover 704 acts as a hard stop within the host device for the module 200. Further, the tapped holes 722A, 722B allow the module 200 to be directly fastened to the connector cover 704 via thumbscrews 214, 216. Direct fastening of the module 200 to the host connector 700 can protect the connector core 702 from mechanical damage caused by external stress in some embodiments. Alternately or additionally, directly securing the module 200 to the host connector 700 can reduce tolerance stack-up between the host connector 700 and module connector 208 and can allow use of an elastomeric EMI gasket 706 at the interface of the module 200 with the host connector 700, in contrast to conventional mechanical platforms where the pluggable module is directly secured to the front panel of the host device.

Figure 7A:
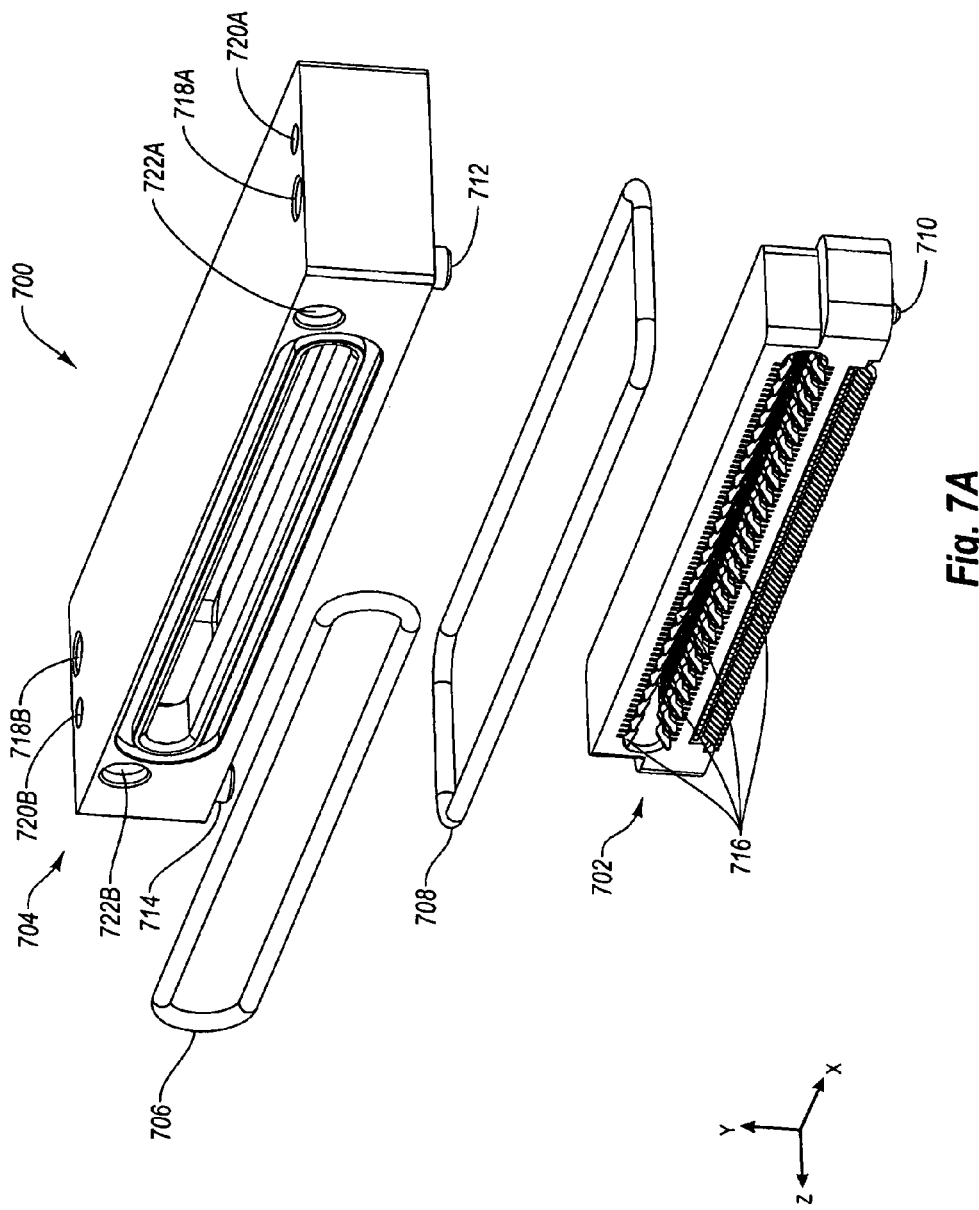
FIG. 7A discloses an example host connector such as may be employed in the host device of FIG. 1.
Figure 7B:
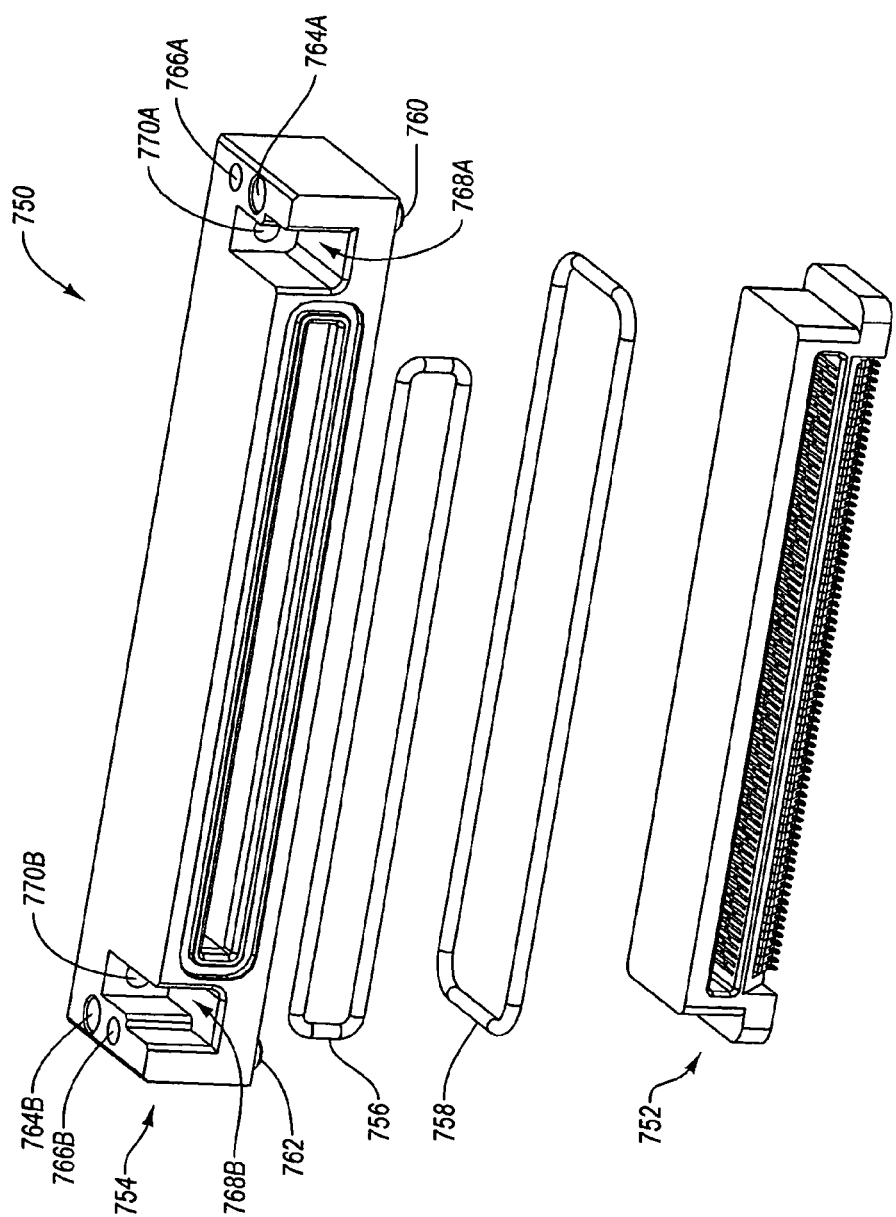
FIG. 7B discloses an example connector cover that can be implemented in the host connector of FIG. 7A.

Turning now to FIG. 7B in combination with FIGS. 3A and 3B, a second example of a host connector 750 is disclosed that may correspond to the host connector 116 of FIG. 1. In some embodiments, the host connector 750 can be implemented with the module 300 of FIGS. 3A and 3B, for instance. The host connector 750 can include a connector core 752, a one-piece connector cover 754, and a plurality of EMI gaskets 756, 758.

Some of the aspects of connector core 752, connector cover 754, and EMI gaskets 756, 758 of FIG. 7B may be similar to those of the connector core 702, connector cover 704, and EMI gaskets 706, 708 of FIG. 7A, while other aspects may be different. For instance, the connector cover 754 of FIG. 7B includes one or more posts 760, 762, a plurality of asymmetrically positioned through-holes 764A, 764B, and a plurality of asymmetrically positioned tapped holes 766A, 766B.

In contrast to the connector cover 704 of FIG. 7A, however, the connector cover 754 includes a plurality of slots 768A, 768B formed in the connector cover 754 to accommodate the extensions 310A, 312A of the module 300 of FIG. 3A. The connector cover 754 further includes a second plurality of tapped holes 770A, 770B configured to receive threaded portions 318, 320 of thumbscrews 314, 316 for threadably securing the module 300 directly to the connector cover 754. Alternately or additionally, the connector cover 754 can include a plurality of tapped inserts, nuts, or the like, disposed in the slots 768A, 768B for receiving threaded portions 318, 320 of thumbscrews 314, 316.

Additional aspects regarding example host connectors that can be implemented in CFP and other mechanical platforms are disclosed in the '027 application.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A pluggable module, comprising:
a shell defining a cavity within which a printed circuit board and one or more components are disposed, the shell including a front, back, first side, and second side;
a module connector operatively connected to the printed circuit board near the back of the shell and extending from within the cavity to outside the shell through an opening defined in the back of the shell, the module connector configured to operatively couple the pluggable module to a host device; and
one or more thumbscrews housed within one or more portions of the shell and configured to threadably secure the pluggable module to the host device, each of the one or more thumbscrews including:
a screw head defining an opening and including one or more resilient members extending outward from a base of the screw head;
a shaft defining a first end including a threaded portion and a second end including one or more cams radially protruding from the second end, the second end extending at least partially into the opening defined by the screw head; and
a torque limiter that includes the one or more resilient members and the one or more cams.

2. The pluggable module of claim 1, further comprising:
protecting means for protecting a portion of the module connector extending outside the cavity from damage; and
a first guiderail defined in the first side and a second guiderail defined in the second side, each of the first and second guiderails extending from the front of the shell to the back of the shell.

3. The pluggable module of claim 2, wherein the protecting means comprise a first portion of the first guiderail and a second portion of the second guiderail, the first and second portions extending outwardly beyond a back end of the module connector.

4. The pluggable module of claim 2, wherein a first thumbscrew is housed within the first guiderail and a second thumbscrew is housed within the second guiderail, the protecting means comprising a portion of each of the first and second thumbscrews extending outwardly beyond a back end of the module connector.

5. A thumbscrew for securing a pluggable module to a host device, comprising:
a screw head defining an opening;
a shaft defining a first end and a second end, the first end including a threaded portion configured to threadably engage a tapped hole of a host device and the second end extending at least partially into the opening; and
a torque limiter that substantially prevents application of tightening torques that exceed a predetermined maximum torque to the shaft when the threaded portion threadably engages the tapped hole of the host device, wherein the torque limiter comprises one or more cantilever springs extending from a base of the screw head and one or more cams radially protruding from the second end of the shaft.

6. The thumbscrew of claim 5, further comprising:
a notch formed in the shaft; and
a retaining clip cooperating with the notch to substantially confine the second end of the shaft within the opening of the screw head.

7. The thumbscrew of claim 5, further comprising an extension formed in the shaft at the first end, the extension configured to cooperate with a shell of a pluggable module in which the thumbscrew is implemented to form a protective barrier around a connector of the pluggable module.

8. The thumbscrew of claim 5, wherein the one or more cantilever springs selectively engage the one or more cams and apply a tightening torque applied to the screw head to the shaft depending on whether the tightening torque exceeds the predetermined maximum torque.

9. The thumbscrew of claim 5, wherein the screw head, shaft, or both, comprise injection molded metal, forged metal, machine turned metal, or broached metal.

10. The thumbscrew of claim 5, wherein the predetermined maximum torque depends on one or more of:
a length of each of the one or more cantilever springs;
a thickness of each of the one or more cantilever springs;
a material from which each of the one or more cantilever springs is made; a quantity of the one or more cantilever springs; or
a coefficient of static friction between the one or more cantilever springs and the one or more cams.

11. The thumbscrew of claim 5, wherein each of the one or more cams comprises a lead-in feature and is characterized by a distance that the cam radially protrudes from the second end.

12. The thumbscrew of claim 11, wherein the predetermined maximum torque depends on one or more of:
the distance that each of the one or more cams radially protrudes from the second end;
a shape of the lead-in feature;
a quantity of the one or more cams; or
a coefficient of static friction between the one or more cams and the one or more cantilever springs.

13. The thumbscrew of claim 11, wherein each of the one or more cams further comprises a trailing feature oppositely disposed from a lead-in feature of the cam, the one or more cantilever springs configured to engage a trailing feature of a corresponding cam and apply a loosening torque applied to the screw head to the shaft.

14. The thumbscrew of claim 11, wherein when a tightening torque that exceeds the predetermined maximum torque is applied to the screw head, the cantilever springs resiliently deflect up and over the lead-in features to disengage from the cams.

15. A thumbscrew for securing a pluggable module to a host device, comprising:
a shaft defining a first end and a second end oppositely disposed from the first end;
a threaded portion formed in the first end and configured to threadably secure a pluggable module to a host device, the pluggable module including a module connector configured to mate with a host connector of the host device; and
a head disposed on the second end of the shaft and configured to apply at least some torque applied to the head to the shaft, the head including one or more cantilever springs configured to selectively engage one or more cams formed in the second end of the shaft and to apply tightening torques applied to the head that do not exceed a predetermined maximum torque to the shaft,
wherein the first end of the shaft is configured to cooperate with a shell of the pluggable module to form a protective barrier for the module connector.

16. The thumbscrew of claim 15, wherein the thumbscrew comprises hardened steel and is configured to absorb impact forces to protect the module connector.

17. The thumbscrew of claim 15, wherein the head is integrally formed in the shaft at the second end.

18. The thumbscrew of claim 15, wherein the head is separable from the shaft and defines an opening configured to at least partially receive the second end of the shaft.

* * * * *

UNITED STATES PATENT AND TRADEMARK OFFICE
CERTIFICATE OF CORRECTION

| | |
|---|---|
| PATENT NO. | : 8,199,494 B2 |
| APPLICATION NO. | : 12/334309 |
| DATED | : June 12, 2012 |
| INVENTOR(S) | : Nguyen |

It is certified that error appears in the above-identified patent and that said Letters Patent is hereby corrected as shown below:

On the Title Page, in Field (73), under "Assignee", in Column 1, Line 1, delete "Finisar Corporation, Inc.," and insert -- Finisar Corporation, --, therefor.

Signed and Sealed this
Ninth Day of April, 2013

Teresa Stanek Rea
*Acting Director of the United States Patent and Trademark Office*